(12) United States Patent
Lan et al.

(10) Patent No.: US 10,857,651 B2
(45) Date of Patent: Dec. 8, 2020

(54) APPARATUS OF CHEMICAL MECHANICAL POLISHING AND OPERATING METHOD THEREOF

(71) Applicant: TAIWAN SEMICONDUCTOR MANUFACTURING COMPANY LTD., Hsinchu (TW)

(72) Inventors: Chun-Kai Lan, Hsinchu (TW);
Tung-He Chou, Hsinchu (TW);
Ming-Tung Wu, Hsinchu (TW);
Sheng-Chau Chen, Tainan (TW);
Hsun-Chung Kuang, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 314 days.

(21) Appl. No.: 15/927,346

(22) Filed: Mar. 21, 2018

(65) Prior Publication Data

US 2019/0152020 A1 May 23, 2019

Related U.S. Application Data

(60) Provisional application No. 62/588,703, filed on Nov. 20, 2017.

(51) Int. Cl.
*B24B 53/00* (2006.01)
*B24B 53/017* (2012.01)
(Continued)

(52) U.S. Cl.
CPC .......... *B24B 53/017* (2013.01); *B24B 37/005* (2013.01); *B24B 37/245* (2013.01);
(Continued)

(58) Field of Classification Search
CPC ..... B24B 53/017; B24B 53/12; B24B 37/005; B24B 37/245; H01L 21/30625
(Continued)

(56) References Cited

U.S. PATENT DOCUMENTS 2,451,295 A * 10/1948 Metzger ................... B24D 7/14
451/548
6,213,856 B1 * 4/2001 Cho ....................... B24B 53/017
451/443
(Continued)

FOREIGN PATENT DOCUMENTS

CN 1841671 A 10/2006
CN 102873639 A 1/2013
(Continued)

OTHER PUBLICATIONS

Office action of Chinese counterpart 201810992219.2 dated Oct. 29, 2019.
(Continued)

*Primary Examiner* — George B Nguyen
(74) *Attorney, Agent, or Firm* — WPAT, P.C., Intellectual Property Attorneys; Anthony King

(57) ABSTRACT

An apparatus for chemical mechanical polishing includes a pad conditioner. The pad conditioner includes a first disk having a first surface and a second disk having a second surface. The first surface has a first plurality of abrasives with a first mean size and the second surface has a second plurality of abrasives with a second mean size greater than the first mean size.

20 Claims, 7 Drawing Sheets

(51) Int. Cl.
  *B24B 53/12*   (2006.01)
  *H01L 21/306*  (2006.01)
  *B24B 37/27*   (2012.01)
  *B24B 37/24*   (2012.01)
  *B24B 37/005*  (2012.01)

(52) U.S. Cl.
  CPC .............. *B24B 37/27* (2013.01); *B24B 53/12* (2013.01); *H01L 21/30625* (2013.01)

(58) Field of Classification Search
  USPC .................................................. 451/56, 443
  See application file for complete search history.

(56) References Cited

U.S. PATENT DOCUMENTS

| | | | | |
|---|---|---|---|---|
| 6,514,127 | B2* | 2/2003 | Huang | B24B 53/017 451/56 |
| 6,609,962 | B1* | 8/2003 | Wakabayashi | B24B 1/04 451/443 |
| 7,052,371 | B2* | 5/2006 | Benner | B24B 53/00 257/E21.23 |
| 7,348,276 | B2 | 3/2008 | Shirasu | |
| 7,901,267 | B1* | 3/2011 | Benner | B24B 53/00 451/21 |
| 8,142,261 | B1* | 3/2012 | Sung | B24B 53/007 451/56 |
| 8,920,214 | B2* | 12/2014 | Sung | B24B 53/017 451/56 |
| 2003/0186627 | A1* | 10/2003 | So | B24B 53/017 451/56 |
| 2003/0190874 | A1* | 10/2003 | So | B24B 29/005 451/56 |
| 2005/0282476 | A1* | 12/2005 | Lujan | B24B 53/003 451/56 |
| 2006/0079160 | A1* | 4/2006 | Balagani | B24B 53/017 451/285 |
| 2006/0172662 | A1* | 8/2006 | Lim | B24B 49/003 451/5 |
| 2007/0077871 | A1* | 4/2007 | Park | B24B 1/04 451/56 |
| 2008/0242199 | A1* | 10/2008 | Saito | B24B 47/00 451/37 |
| 2010/0291840 | A1* | 11/2010 | Huang | B24B 53/003 451/56 |
| 2010/0311309 | A1* | 12/2010 | Shinozaki | B24B 49/08 451/5 |
| 2013/0122783 | A1* | 5/2013 | Menk | B24B 37/042 451/11 |
| 2015/0367480 | A1* | 12/2015 | Chou | B24B 53/017 451/443 |
| 2016/0346901 | A1* | 12/2016 | Chou | B24B 53/017 |
| 2019/0193245 | A1* | 6/2019 | Tregub | B24B 37/20 |

FOREIGN PATENT DOCUMENTS

| | | |
|---|---|---|
| CN | 203317219 U | 12/2013 |
| CN | 104508802 A | 4/2015 |
| CN | 105531082 A | 4/2016 |
| TW | 200634918 | 7/1994 |
| TW | 201738034 A | 11/2017 |
| WO | WO 2017123834 A1 | 7/2017 |

OTHER PUBLICATIONS

Office Action and Search Report dated Feb. 20, 2020 issued by Taiwan Intellectual Property Office for counterpart application No. 107127502.
U.S. Pat. No. 7,348,276 serves as the English counterpart application for Foreign Reference TW 200634918.
WIPO International Publication No. 2017123834 A1 serves as the English counterpart application to Foreign Reference TW 201738034 A.
Office action of Chinese counterpart 201810992219.2 dated Mar. 9, 2020.
U.S. Pat. No. 892,021 is the counterpart for CN102873639.
Office action of Chinese counterpart 201810992219.2 dated Jun. 15, 2020.

* cited by examiner

APPARATUS OF CHEMICAL MECHANICAL POLISHING AND OPERATING METHOD THEREOF

PRIORITY CLAIM AND CROSS-REFERENCE

This application claims priority to U.S. patent application Ser. No. 62/588,703 filed Nov. 20, 2017, the disclosure of which is hereby incorporated by reference in its entirety.

BACKGROUND

In advanced semiconductor technologies, the continuing reduction in device size and increasingly complicated circuit designs have made the designing and fabrication of integrated circuits (ICs) more challenging and costly. For producing semiconductor IC components with desirable dimensions, chemical mechanical polishing (CMP) processes have been used to remove unwanted material from semiconductor wafer surfaces between and during operations of manufacturing semiconductor wafers. A CMP apparatus usually includes a polishing pad for performing the CMP process, in which the polishing pad polishes an exposed layer of the semiconductor wafer using the polishing pad's rough surface. During the CMP operation, the polishing pad may become smoother, which degrades the polishing performance and efficiency. Therefore, it is necessary to have a reconditioning process to recreate the rough surface of the polishing pad.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
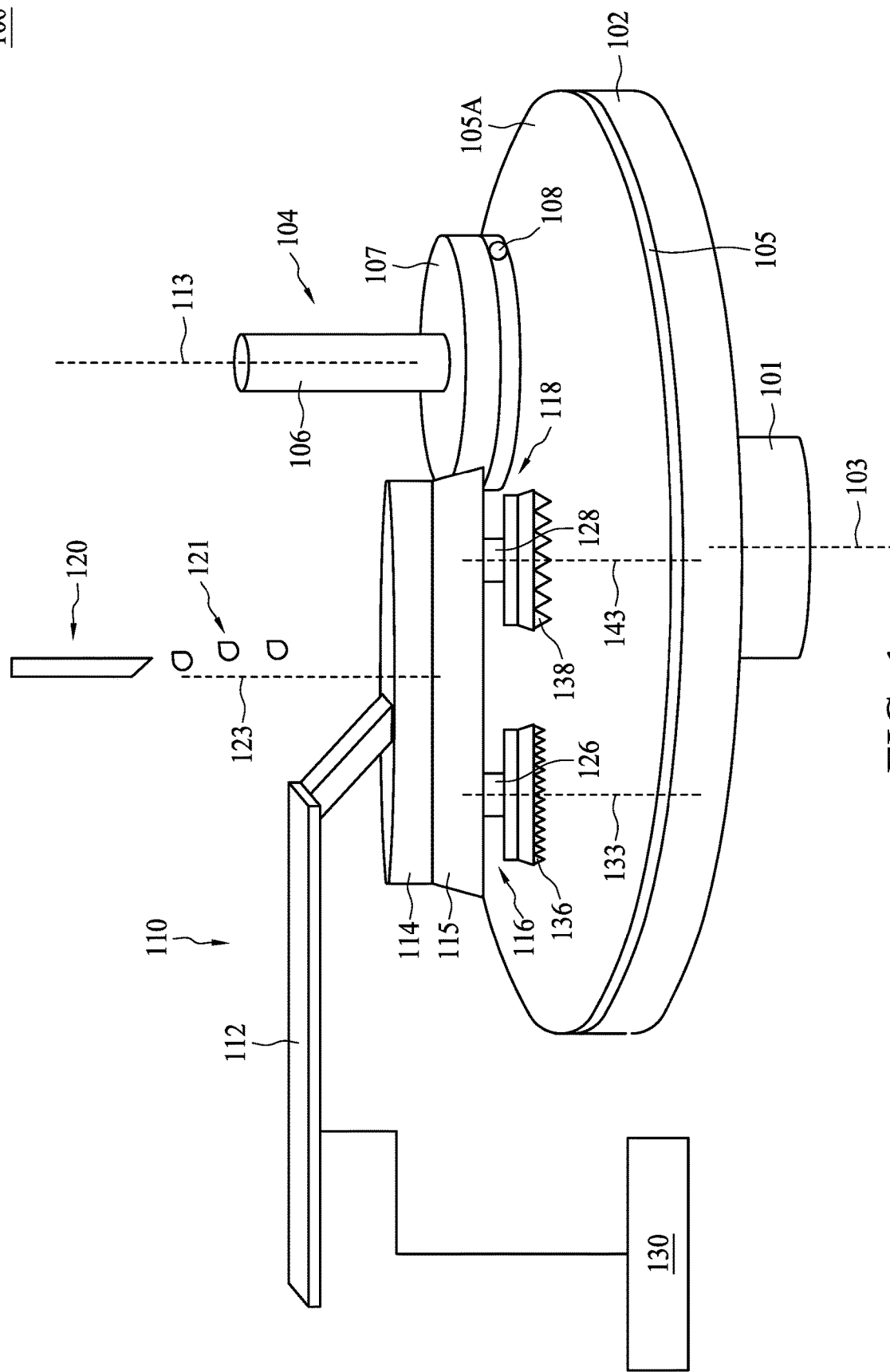
FIG. 1 is a schematic diagram illustrating a CMP apparatus, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, various elements, compounds, regions, layers or sections, are modified by terms such as "first" and "second," but should not be limited by these modifying terms. These terms may be used merely to distinguish one element, component, region, layer or section from another. The terms such as "first" and "second" when used herein do not imply a sequence or order unless clearly indicated in the context.

As used herein, the term "substantially" refers to the complete or nearly complete extent or degree of an action, characteristic, property, state, structure, item, or result. For example, a surface that is "substantially" coplanar with another surface would mean that these two surfaces are either completely located in the same plane or nearly completely located in the same plane. The exact allowable degree of deviation from absolute completeness may in some cases depend on the specific context. In some examples, the allowable degree of deviation is less than about 0.1%. In some examples, the allowable degree of deviation is less than about 1% or 5%. In some examples, the allowable degree of deviation is less than about 10%. However, generally the nearness of completion will be regarded as the same overall result as if absolute and total completion is obtained.

In the present disclosure, a chemical mechanical polishing (CMP) apparatus and an operating method thereof are proposed. During operations of manufacturing a semiconductor device, the CMP apparatus is used to remove an amount of excess material in a semiconductor device, thereby obtaining desirable component geometries. The CMP apparatus usually includes a polishing pad with a rough contact surface, and the polishing performance is determined largely by the asperity structure of the contact surface. Thus, it is necessary to maintain the roughness properties of the contact surface after the surface is worn out after extensive use. Such surface re-roughening process may be repeated periodically and is referred to as polishing pad dressing or polishing pad conditioning.

According to embodiments of the present disclosure, a pad conditioner having multiple polishing disks is proposed. The various disks include contact surfaces with different configurations that may enhance the pad conditioning performance and efficiency. Additionally, a vibration module is incorporated into the pad conditioner according to some embodiments. A modified polishing disk structure is proposed to work with the vibration module. As a result, the cutting rate for dressing the polishing pad is increased while the achieved pad roughness is reduced. The thickness uniformity of the polished levels for semiconductor devices within a same wafer or across different wafers can be thus improved. In addition, undesirable polishing defects, such as dishing effect or surface scratches, can be relieved through the proposed pad conditioner structure.

FIG. 1 is a schematic diagram illustrating a CMP apparatus 100, in accordance with some embodiments. As shown in FIG. 1, the CMP apparatus 100 includes a platen 102, a wafer carrier 104 and a pad conditioner 110. A polishing pad 105 is disposed on the platen 102 and includes a polishing surface 105A facing the wafer carrier 104 and the pad conditioner 110. In some embodiments, the platen 102 may be supported by a base 101 and may rotate the polishing pad 105 about a first axis 103.

The wafer carrier 104 includes a shaft 106 and a plate 107 coupled to the shaft 106. The shaft 106 is configured to rotate about a second axis 113. The plate 107 is configured to hold a working piece 108, such as a semiconductor wafer. In some embodiments, the wafer carrier 104 is configured to move the wafer 108 upward or downward such that the wafer 108 can be engaged with the polishing surface 105A. In some embodiments, the plate 107 may hold the wafer 108 by vacuum, electrostatic charge (ESC) or the like. During operation, the polishing pad 105 rotates about the first axis 103 and the wafer carrier 104 rotates about the second axis 113. The wafer 108 contacts the polishing pad 105 thereby causing an amount of a layer or material on the wafer 108 to be polished. The platen 102 and the wafer carrier 104 may rotate in the same direction, or may rotate in different directions. In some embodiments, the wafer carrier 104 can rotate about the first axis 103 as well, but is not limited thereto. In some embodiments, the platen 102 may be vertically movable with respect to the wafer carrier 104 such that the wafer carrier 104 may be in contact with the wafer 108 for polishing the wafer 108.

In some embodiments, the wafer 108 includes a semiconductor substrate (not separately shown), such as a bulk semiconductor substrate. The bulk semiconductor substrate may include an elementary semiconductor, such as silicon; a compound semiconductor, such as silicon germanium or silicon carbide; or combinations thereof. In some embodiments, the wafer 108 includes an array of dies each having several devices such as circuitries, transistors, etc. formed on or in the wafer 108. In some embodiments, the circuitries formed on or in the wafer 108 may be any types of circuitries suitable for a particular application. In some embodiments, the wafer 108 may include a CMOS substrate. In some embodiments, the wafer 108 may include a stacked wafer. In some embodiments, a backside of the substrate in the wafer 108, on which no circuitries are formed, faces the polishing pad 105 and is to be thinned or polished through the CMP operation. In some embodiments, a layer of the wafer 108 facing the polishing pad 105 is a dielectric or conductive layer of the circuitries to be thinned.

The pad conditioner 110 includes an arm 112, a body 114, a mother disk 115, a first disk 116 and a second disk 118. The first disk 116 and the second disk 118 are polishing disks for performing pad dressing or pad conditioning. In some embodiments, the first disk 116 and the second disk 118 are disposed over a same side of the mother disk 115. The body 114 is coupled to the first disk 116 and the second disk 118. The arm 112 holds the body 114 and is configured to move the pad conditioner 110 over and across the polishing surface 105A. The body 114 couples the arm 112 with the mother disk 115. In some embodiments, the arm 112 is configured to exert a downward force against the first disk 116 and the second disk 118 through the body 114 and the mother disk 115.

During operation, the polishing pad 105 rotates about the first axis 103, and the mother disk 115 rotates about a third axis 123. The platen 102 and the mother disk 115 may rotate in the same direction, or in different directions. In some embodiments, the mother disk 115 of the pad conditioner 110 can rotate about the first axis 103 as well, but the present disclosure is not limited thereto. In some embodiments, the platen 102 may be vertically movable with respect to the pad conditioner 110 such that the polishing pad 105 may contact the first disk 116 or the second disk 118 for performing pad conditioning.

In some embodiments, the mother disk 115, the first disk 116 and the second disk 118 have rotation speeds of less than about 500 rpm. The depicted configuration of two disks for the pad conditioner 110 is for illustration only. The number of disks for the pad conditioner 110 may be more than two. In a multiple-disk configuration, the various disks may be disposed below the mother disk 115 and are rotated by the mother disk 115 in a planetary motion. In some embodiments, the various disks may have their own rotation directions and rotation speeds.

The first disk 116 is coupled to the mother disk 115 through a first shaft 126. During operation, the mother disk 115 of the pad conditioner 110 rotates about the third axis 123, and the first disk 116 rotates about a fourth axis 133 of the first shaft 126. The mother disk 115 and the first disk 116 may rotate in the same direction, or in different directions. In some embodiments, the first disk 116 can rotate about the third axis 123 as well, but the present disclosure is not limited thereto.

The second disk 118 is coupled to the mother disk 115 through a second shaft 128. During operation, the mother disk 115 rotates about the third axis 123, and the second disk 118 rotates about a fifth axis 143. The mother disk 115 and the second disk 118 may rotate in the same direction, or in different directions. In some embodiments, the first disk 116 and the second disk 118 may rotate in the same direction, or in different directions. In some embodiments, the second disk 118 can rotate about the third axis 123 as well, but the present disclosure is not limited thereto.

The first shaft 126 and the second shaft 128 are configured to hold the first disk 116 and the second disk 118, respectively. Further, the first disk 116 has a first surface 136 with an asperity structure facing the polishing surface 105A of the polishing pad 105. In some embodiments, the first surface 136 includes some polishing teeth or polishing abrasives. In some embodiments, the first shaft 126 is movable or retractable so as to move the first disk 116 to engage the first surface 136 with the polishing surface 105A. In some embodiments, the first shaft 126 includes a pump to enable the movement of the first shaft 126. In some embodiments, the first shaft 126 is replaced with an arm structure that may be similar to the arm 112 and is foldable to move the first disk 116 upward and downward.

Similarly, the second disk 118 has a second surface 138 with an asperity structure facing the polishing surface 105A. The second shaft 128 is movable or retractable so as to move the second disk 118 to engage the second surface 138 with the polishing surface 105A. In some embodiments, the second shaft 128 includes a pump to enable the movement of the second shaft 128. In some embodiments, the second shaft 128 is replaced with an arm structure that may be similar to the arm 112 and is foldable to move the second disk 118 upward and downward. In some embodiments, the second surface 138 includes some polishing teeth or polishing abrasives.

In some embodiments, the CMP apparatus 100 further includes a control module 130 coupled to the pad conditioner 110. The control module 130 may be configured to transmit control signals to the pad conditioner 110 for communicating polishing parameters of the mother disk 115, the first disk 116 and the second disk 118, such as the selection of working disks, rotation speed, rotation directions, or the like. In some embodiments, the control module 130 is configured to communicate configuration parameters (e.g., expansion and retraction) of the first shaft 126 and the second shaft 128. In some embodiments, the control module 130 may be implemented using electronic circuits and may include, for example, a microcontroller, a memory, an FPGA or the like.

In some embodiments, the first disk 116 and the second disk 118 include a first sensor 206 and a second sensor 216, respectively. In some embodiments, the first sensor 206 and the second sensor 216 face the pad surface 105A. In some embodiments, the first sensor 206 or the second sensor 216 is exposed through the first surface 136 or the second surface 138, respectively. In some embodiments, the first sensor 206 or the second sensor 216 is a pressure sensor which can help detect a pressure value during a polishing operation. Measurements of the detected pressure value are transmitted to the control module 130 in order to determine a proper pressing pressure. In some embodiments, the first sensor 206 or the second sensor 216 is a proximity sensor or ranging sensor configured to detect a gap between the pad surface 105A and the first disk 116 or the second disk 118. Accordingly, the first surface 136 and the second surface 138 can be maintained at an equal height or different heights. The operating factors for the first disk 116 and the second disk 118 can be better managed.

In some embodiments, the CMP apparatus 100 further includes a slurry feed 120 for dispensing slurry 121 to the polishing surface 105A of the polishing pad 105. The slurry 121 may be provided in a liquid or aqueous form via a nozzle of the slurry feed 120. A typical slurry 121 is a water-based solution and contains chemicals and physical abrasives which are used for polishing the wafer 108 in conjunction with the polishing pad 105. In some embodiments, the polishing abrasives in the slurry 121 may have different shapes, such as a ball shape, a spheroid shape, an ellipsoid shape, or the like. In some embodiments, the polishing abrasives in the slurry 121 are made of metal ceramic composites. In some embodiments, the polishing abrasives in the slurry 121 are made of corudum, tungsten carbide, silicon carbide (carborundum), titanium carbide, boron, boron nitride, rhenium diboride, stishovite, titanium diboride, diamond, carbonado or the like.

Figure 2A:
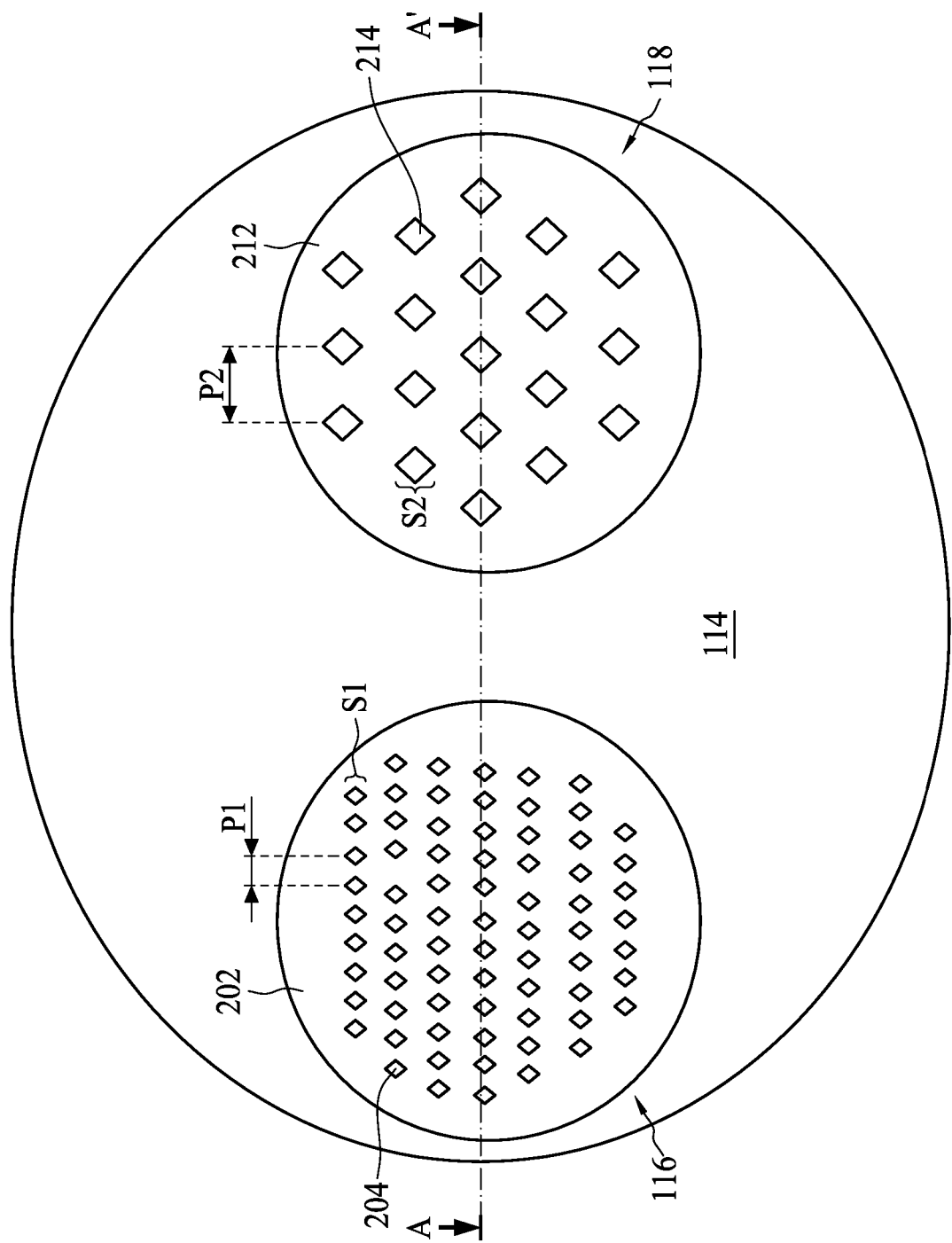
FIG. 2A is a schematic bottom view of a pad conditioner of the CMP apparatus in FIG. 1, in accordance with some embodiments.
Figure 2B:
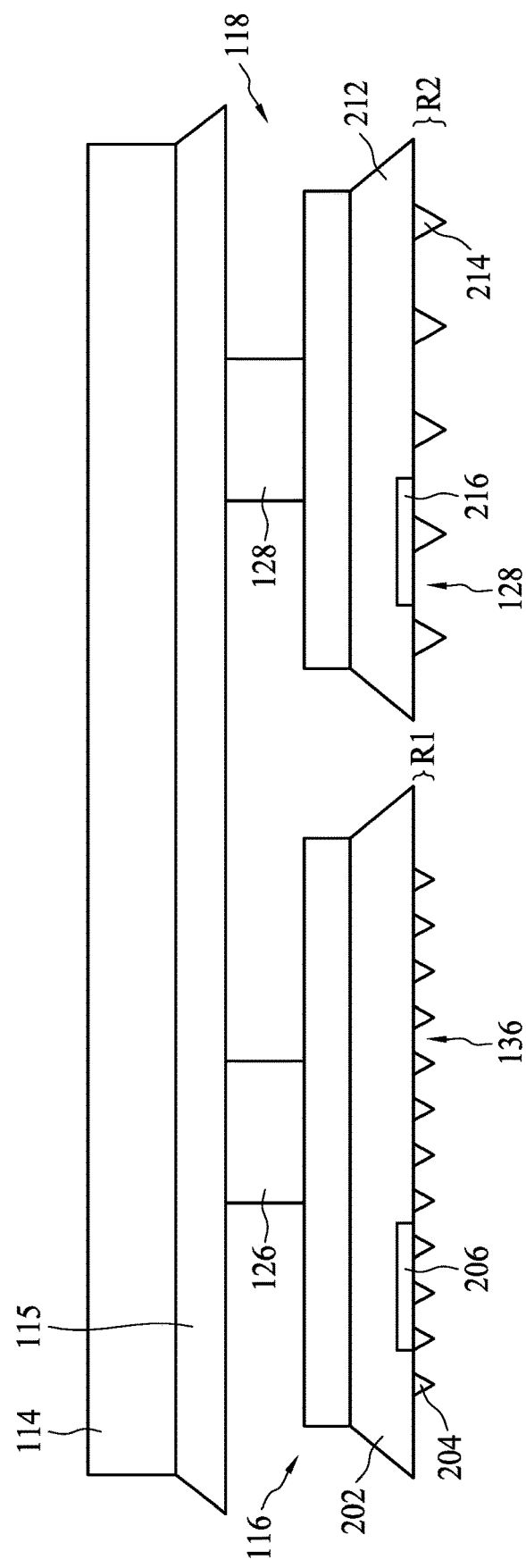
FIG. 2B is a schematic cross-sectional view of a pad conditioner of the CMP apparatus in FIG. 1, in accordance with some embodiments.

FIG. 2A is a schematic bottom view of the pad conditioner 110 of the CMP apparatus 100 in FIG. 1, in accordance with some embodiments. FIG. 2B is a schematic cross-sectional view of the pad conditioner 110 taken along sectional line AA'. Some features of the pad conditioner 110, such as the first shaft 126 and the second shaft 128, are omitted from FIG. 2A for clarity and simplicity. The first disk 116 includes a first base material 202 and a plurality of first abrasives 204 fixed in the first base material 202. In some embodiments, the first base material 202 may include polymeric material, composite material or the like. The first base material 202 may be configured as a molding layer to fix the plurality of first abrasives 204. In some embodiments, the first abrasives 204 may be formed of corudum, tungsten carbide, silicon carbide (carborundum), titanium carbide, boron, boron nitride, rhenium diboride, stishovite, titanium diboride, diamond, carbonado or the like. In some embodiments, the first abrasives 204 may have a ball shape, an ellipsoid shape, a spheroid shape, or the like. In some embodiments, the first abrasives 204 may have a polyhedral shape, and may include a multi-facet conical shape, a multi-facet cylindrical shape, a multi-facet ball shape, or the like. Some of the first abrasives 204 protrude from the relatively smooth surface of the first base material 202, resulting in the asperity structure of the first surface 136 (see FIG. 2B). In some embodiments, the first abrasives 204 have acute tips protruding from the first surface 136. As an exemplary method of forming the first surface 136, the first abrasives 204 may be mixed in the first base material 202 in the form of fluid. After solidification, the plurality of first abrasives 204 can be contained within the first base material 202, and some of the first abrasives 204 protrude from the first base material 202. In some embodiments, the first base material 202 is formed of metal and the plurality of first abrasives 204 are mounted on a surface of such metal. The roughness of the polished pad surface 105A may be determined by factors of the abrasives 204 or 214, including at least one of the abrasive size, the abrasive surface density, and the abrasive pitch. In an embodiment, a roughness value Ra of the pad surface 105A is calculated as the arithmetic average of the absolute values of the surface profile height deviations from a mean line (not separately shown). Simply put, the roughness value Ra is the average of a set of individual measurements of peaks and valleys of the pad surface 105A.

In some embodiments, the first abrasives 204 have a first configuration. For example, the first abrasives 204 may be randomly or uniformly distributed in the first base material 202. In the depicted example, the first abrasives 204 are arranged substantially uniformly distributed. The first configuration may be determined so as to apply a relatively low dressing pressure or force on the pad surface 105A. Referring to FIG. 2B, in some embodiments, the first configuration of the first abrasives 204 on the first surface 136 has a first pitch P1. In some embodiments, the first pitch P1 is between about 100 μm and about 250 μm, for example 150 μm. In some embodiments, the first configuration has a first surface density D1 for the first abrasives 204. In some embodiments, the first surface density D1 is greater than about 2000 grains/cm$^2$. In some embodiments, the first surface density D1 is between about 2000 grains/cm$^2$ and about 5000 grains/cm$^2$, for example 4500 grains/cm$^2$. Referring back to FIG. 2A, in some embodiments, the first configuration has a mean size S1 of the first abrasives 204. An abrasive's size may be defined by its geometry such as its width, length, diameter, or the like. In some embodiments, the mean size of the first abrasives 204 refers to an arithmetic or geometric mean value of the first abrasives 204. In some embodiments, the first mean size S1 is less than about 100 μm. In some embodiments, the first mean size S1 is between about 20 μm and about 100 μm, for example 50 μm.

The second disk 118 includes a second base material 212 and a plurality of second abrasives 214 fixed in the first base material 202. In some embodiments, the second base material 212 may include polymeric material, composite material or the like. The second base material 212 may be configured as a molding layer to fix the plurality of second abrasives 214. In some embodiments, the second abrasives 214 may be formed of corudum, tungsten carbide, silicon carbide (carborundum), titanium carbide, boron, boron nitride, rhenium diboride, stishovite, titanium diboride, diamond, carbonado or the like. In some embodiments, the second base material 212 and the second abrasives 214 may possess materials similar to those of the first base material 202 and the first abrasives 204, respectively. The second abrasives 214 protrude from the relatively smooth surface of the first base material 212, resulting in the asperity structure of the second surface 138 (see FIG. 2B). In some embodiments, the second abrasives 214 have acute tips protruding from the second surface 138.

In some embodiments, the second abrasives 214 may have a second abrasive configuration. For example, the second abrasives 214 may be randomly or uniformly distributed in the second base material 212. In the depicted example, the second abrasives 214 are arranged substantially uniformly distributed. The second configuration may be determined so as to apply a relatively high dressing pressure or force on the pad surface 105A. Referring to FIG. 2B, in some embodiments, the second configuration of the second abrasives 214 has a second pitch P2 on the second surface 138. In some embodiments, the second pitch P2 is greater than about 250 μm. In some embodiments, the second pitch P2 is between about 250 μm and about 600 μm, for example 500 μm. In some embodiments, the second configuration of the second abrasives 214 has a second surface density D2. In some embodiments, the second surface density D2 is less than about 1000 grains/cm $^2$. In some embodiments, the second surface density D2 is between about 100 grains/cm$^2$ and about 1000 grains/cm$^2$, for example 400 grains/cm$^2$. Referring back to FIG. 2A, in some embodiments, the second configuration has a mean size S2 for the second abrasives 214. In some embodiments, the second mean size S2 is greater than about 150 μm. In some embodiments, the second mean size S2 is between about 150 μm and about 400 μm, for example 200 μm.

In the present embodiment, the first pitch P1 is smaller than the second pitch P2. In some embodiments, the first mean size S1 is smaller than the second mean size S2. In some embodiments, the first surface density D1 is greater than the second surface density D2. In the above some embodiments, the downward force or pressure applied to the first abrasives 204 are less than that applied to the second abrasives 214. The different configurations for the first abrasives 204 and the second abrasives 214 may help in enhancing the pad conditioning performance of the pad conditioner 110. The factors of pad conditioning performance include at least the cutting rate, polishing pad surface uniformity, pad surface defects, and other factors. It has been found that a pad conditioner using a polishing disk along with a greater dressing force (e.g., using a larger abrasive size) provides a higher cutting rate for the polishing pad and better debris removal from grooves on the pad surface 105A. However, such arrangement might generate more deep pores and degrade the level uniformity as well as leaving more surface defects, such as burr structures on the grooves on the pad surface 105A. Further, a pad conditioner using a polishing disk along with a smaller dressing force (e.g., using a smaller abrasive size) improves the level uniformity and leaves fewer burrs on the grooves, though the cutting efficiency is reduced. In view of the above, the multi-disk pad conditioner 110 as proposed leverages both advantages of the large-abrasive disk 118 and the small-abrasive disk 116 to re-roughen the pad surface 105A of the polishing pad 105. The shortcomings of either the large-abrasive disk 118 or the small-abrasive disk 116 employed alone may be mitigated significantly by using both in combination.

Figure 3:
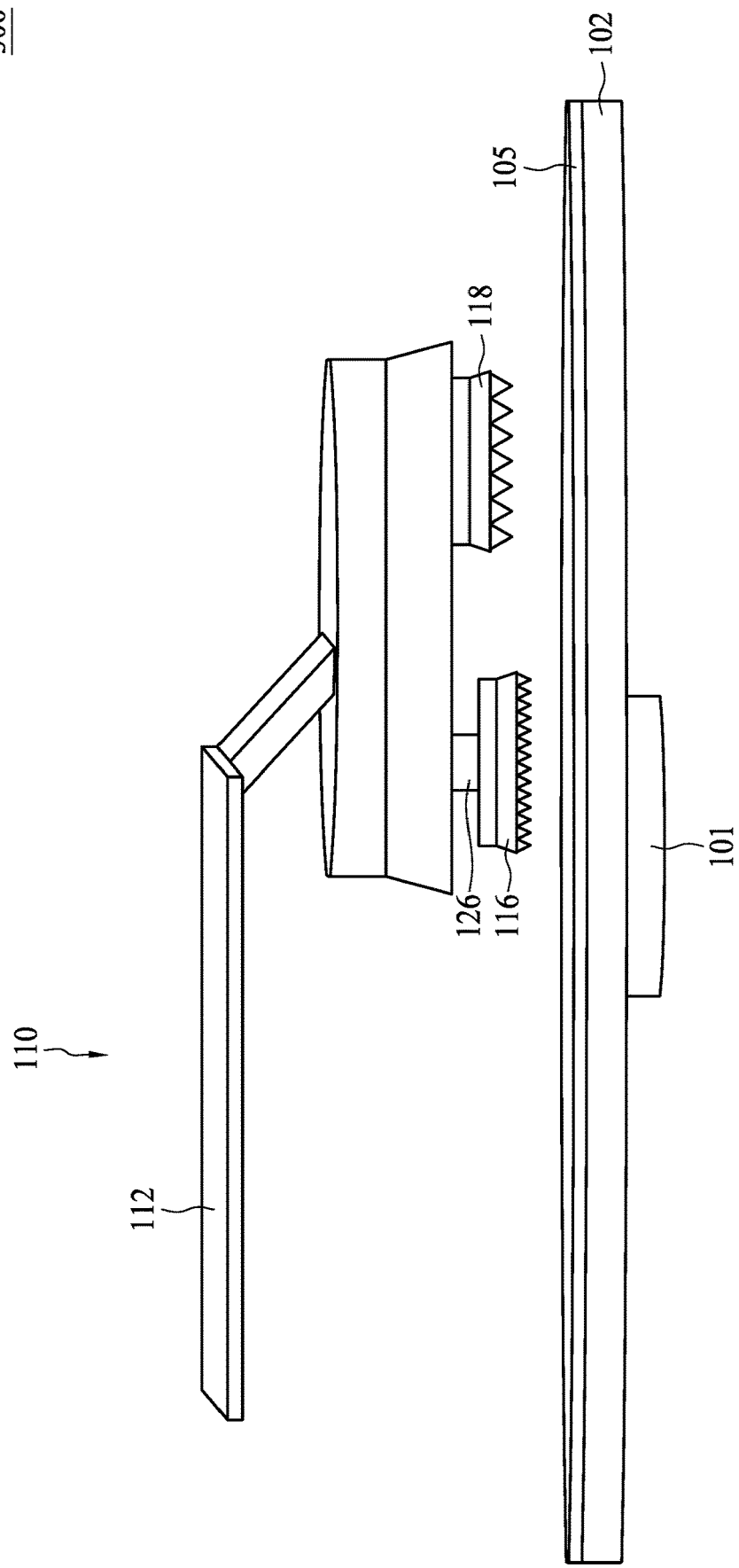
FIG. 3 is a schematic diagram illustrating a CMP apparatus, in accordance with some embodiments.

FIG. 3 is a schematic diagram illustrating a CMP apparatus 300, in accordance with some embodiments. The CMP apparatus 300 and the CMP apparatus 100 shown in FIG. 1 are seen as similar apparatus while operating under different modes. A method of operating a CMP apparatus associated with the CMP apparatus 100 is thus applied based on at least the different modes shown in FIG. 1 and FIG. 3. The first shaft 126 and the second shaft 128 are retractable to move the first disk 116 and the second disk 118, respectively, vertically downward and upward over the polishing pad 105. In FIG. 1, a dual-disk mode is operated in which the first shaft 126 and the second shaft 128 simultaneously extend toward the polishing pad 105. In FIG. 3, a single-disk mode is used in which the second shaft 128 retracts from the polishing pad 105 and the first shaft 126 remains extended toward the polishing pad 105 such that the first disk 116 and the second disk 118 are disposed at different levels. The first shaft 126 may retract to move the first disk 116 away from the pad surface 105A during the dual-disk mode in a similar manner, such that the first disk 116 and the second disk 118 are engaged with the pad surface 105 alternately. Through mode switching, the first disk 116 and the second disk 118 can dress the polishing pad 105 either simultaneously or alternately. In an embodiment of the single-disk mode, the alternate pad conditioning by the first disk 116 and the second disk 118 may be repeated several times until a desirable pad surface 105A is obtained. In an embodiment, a pad conditioning sequence is determined in which the second disk 118 with a relatively greater mean abrasive size (alternatively, a greater abrasive pitch or a lower abrasive density) is configured to dress the polishing pad 105 as a beginning stage of the pad conditioning sequence. In an embodiment, in a pad conditioning sequence the first disk 116 with a smaller mean abrasive size (alternatively, a less abrasive pitch or a higher abrasive density) is configured to dress the polishing pad 105 as a concluding stage of the pad conditioning sequence.

Figure 4:
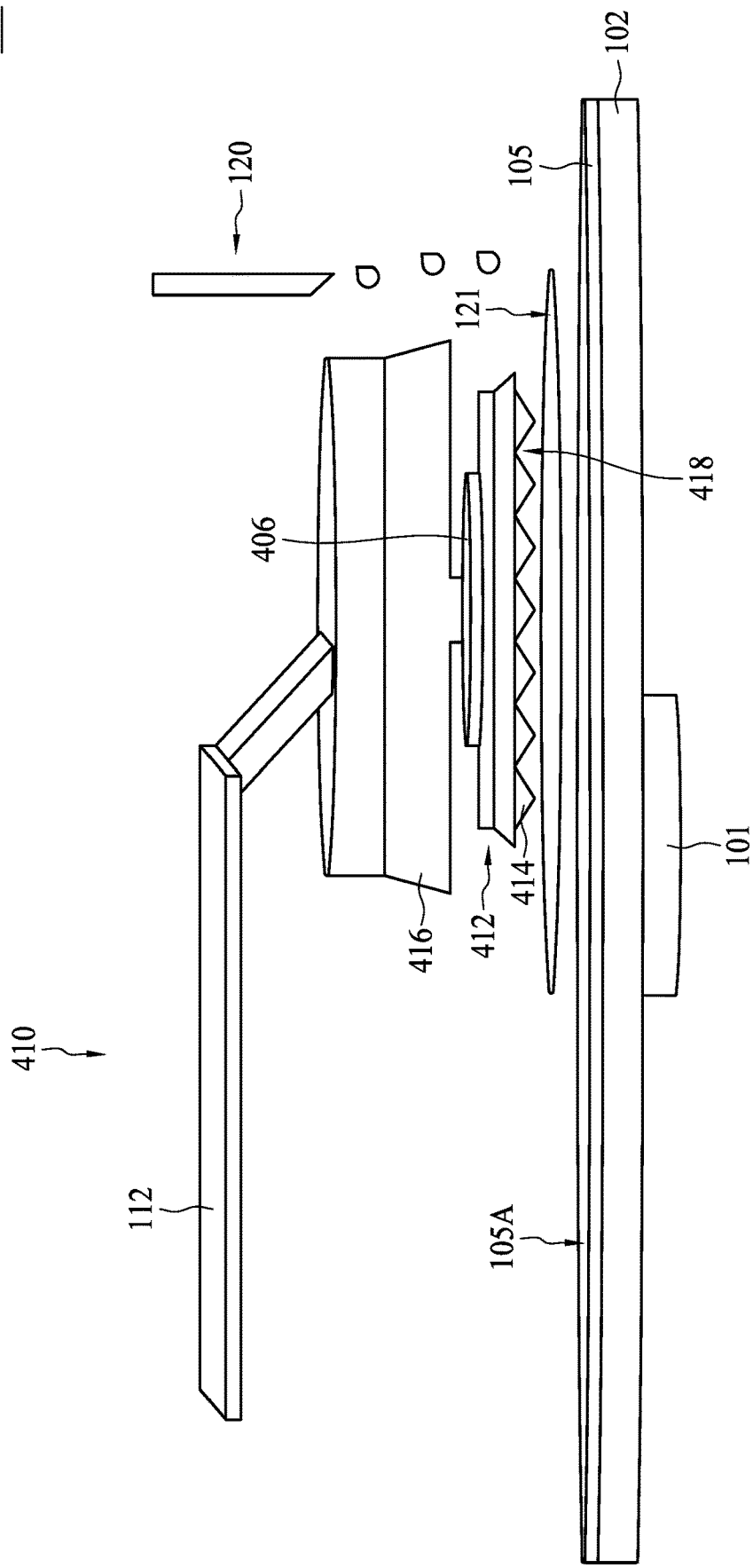
FIG. 4 is a schematic diagram illustrating a CMP apparatus, in accordance with some embodiments.

FIG. 4 is a schematic diagram illustrating a CMP apparatus 400, in accordance with some embodiments. The CMP apparatus 400 includes the platen 102 and a pad conditioner 410. The polishing pad 105 is disposed on the platen 102 and includes a polishing surface 105A facing the pad conditioner 410. The CMP apparatus 400 may include the wafer carrier 104, though it is not illustrated in FIG. 4. The platen 102 is configured to fix the polishing pad 105 and is supported by the base 101. The pad conditioner 410 is disposed over the polishing pad 410. The pad conditioner 410 includes the arm 112, a body 416, a dressing disk 412 and a vibration module 406. In some embodiments, a mother disk may be disposed between the body 416 and the dressing disk 412 of the CMP apparatus 400. The dressing disk 412 has abrasives 414 constituting a rough surface 418. The configurations and methods of operations for the dressing disk 412 are similar to those of the first disk 116 or the second disk 118 illustrated in FIG. 1 and FIG. 3.

The vibration module 406 is configured to vibrate the dressing disk 412. In an embodiment, the vibration module 406 is disposed over the dressing disk 412. In an embodiment, the vibration module 406 is disposed between the arm 112 and the dressing disk 412. In an embodiment, the vibration module 406 is disposed between the body 416 and the dressing disk 412. In an embodiment, the vibration module 406 is integrated with the body 416. In an embodiment, the vibration module 406 is in contact with the dressing disk 412, for example, the vibration module 406 is disposed on an upper surface of the dressing disk 412 for vibrating the dressing disk 412 more effectively.

In an embodiment, the vibration module 406 causes abrasives 414 of the dressing disk 412 to vibrate during the pad conditioning process. In an embodiment, the vibration module 406 is configured to generate an acoustic wave with ultrasonic frequencies above sonic waves. In an embodiment, the vibration module 406 may transmit energy toward the slurry 121 between the polishing pad 105 and the dressing disk 412. In an embodiment, the acoustic wave has a frequency higher than about 20 kilohertz, for example, between about 20 kilohertz and about 200 kilohertz. In an embodiment, the vibration module 406 is configured to generate an acoustic wave with megasonic frequencies in a range from about 0.8 megahertz to about 2 megahertz. In an embodiment, the vibration module 406 may cause an acoustic streaming effect within the fluid slurry 121. In addition, the vibration module 406 may produce a cavitation or bubble effect in order to facilitate cleaning the debris from the pad surface 105A. The implosion phenomenon resulting from the cavitation effect may help break agglomerates of particles in the slurry 121 and debris left in the polishing process into smaller pieces and move the broken particles or debris away from the surface 105A more quickly. In some embodiments, the acoustic wave causes the abrasives 414 to move in a non-monotonic movement trajectory during pad conditioning, and may provide a vertical cutting force and a lateral cutting force on the polishing pad 105. A reduced pad roughness and increased removal rate for dressing the polishing pad 105 can be obtained simultaneously. The vibration module 406 shown in FIG. 4 is illustrative only. In some embodiments, the vibration module 406 can be integrated into the CMP apparatus 100 shown in FIG. 1 to cooperate with multiple polishing disks, such as the first disk 116 and the second disk 118.

The vibration module 406 can be implemented in many ways. In an embodiment, the vibration module 406 comprises an acoustic transducer. In some embodiments, the vibration module 406 may be composed of piezoelectric materials sandwiched by a front metal and a back metal (not separately shown), and generate an acoustic wave with the inverse piezoelectric effect. In some other embodiments, the vibration module 406 may be formed of a magnet and a coil (not separately shown) where the acoustic wave is generated following the principle of electromagnetism.

Figure 5B:
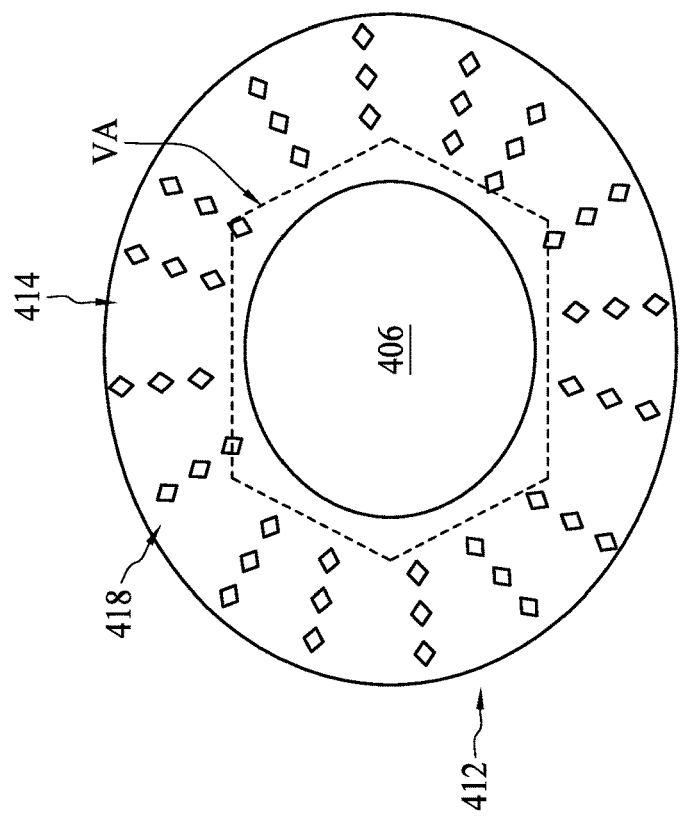
FIGS. 5A and 5B are schematic bottom views of the pad conditioner of the CMP apparatus in FIG. 4, in accordance with some embodiments.
Figure 5A:
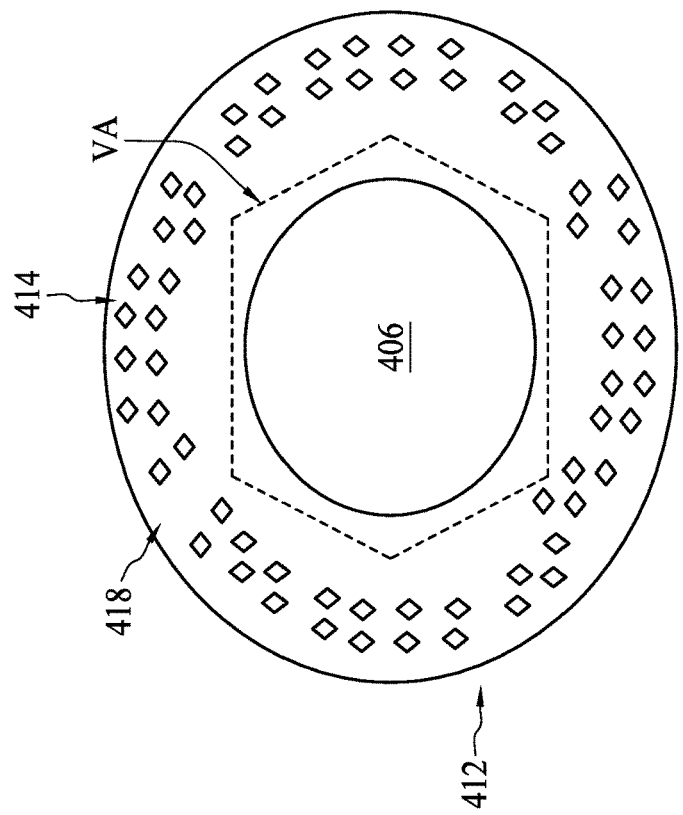

FIG. 5A is a schematic bottom view of the pad conditioner 410 of the CMP apparatus 400 in FIG. 4, in accordance with some embodiments. Some features of the pad conditioner 410, such as the arm 112 and the body 416, are omitted from FIG. 4 for simplicity and clarity. In an embodiment, the vibration module 406 is configured to generate acoustic waves with constructive interference around the rough surface 418 of the dressing disk 412 so as to magnify the vibration effect of the acoustic wave applied onto the dressing disk 412 and the slurry 121. Such constructive or destructive interference may determine the eventual vibration effect of the acoustic wave in addition to the wave intensity generated by the vibration module 406. In some embodiments, a clearance area VA illustrated by dashed lines on the surface 418 is defined in a central region of the dressing disk 412 where substantially no abrasives are disposed in order to facilitate constructive interference of the acoustic wave. In some embodiments, the abrasives 414 have a first surface density outside the area VA greater than a second surface density within the area VA. In an embodiment, the second surface density is substantially zero. The acoustic waves may contribute constructive interference within the area VA around the surface 418. In some embodiments, the clearance area VA is set as a polygonal shape, such as a quadrilateral shape or a hexagonal shape (as shown in FIG. 5A), a circular shape, or the like. In some embodiments, the vibration module 406 has a projection region within the area VA such that the vibration module 406 is spaced horizontally apart from the abrasives 414. In an embodiment, the abrasives 414 of the dressing disk 412 may be distributed non-uniformly on the surface 418. In an embodiment, the abrasives 414 are distributed in a periphery of the dressing disk 412. In some embodiments, the abrasives 414 are distributed as a ring shape on the surface 418. In some embodiments, the abrasives 414 are distributed at corners of the surface 418. Referring to FIG. 5B, the abrasives 414 are distributed outside the area VA and form radial lines on the surface 418. The abrasive configurations shown in FIGS. 5A and 5B can be applied to each of the multiple disks in the pad conditioner 110 shown in FIG. 1.

Figure 6:
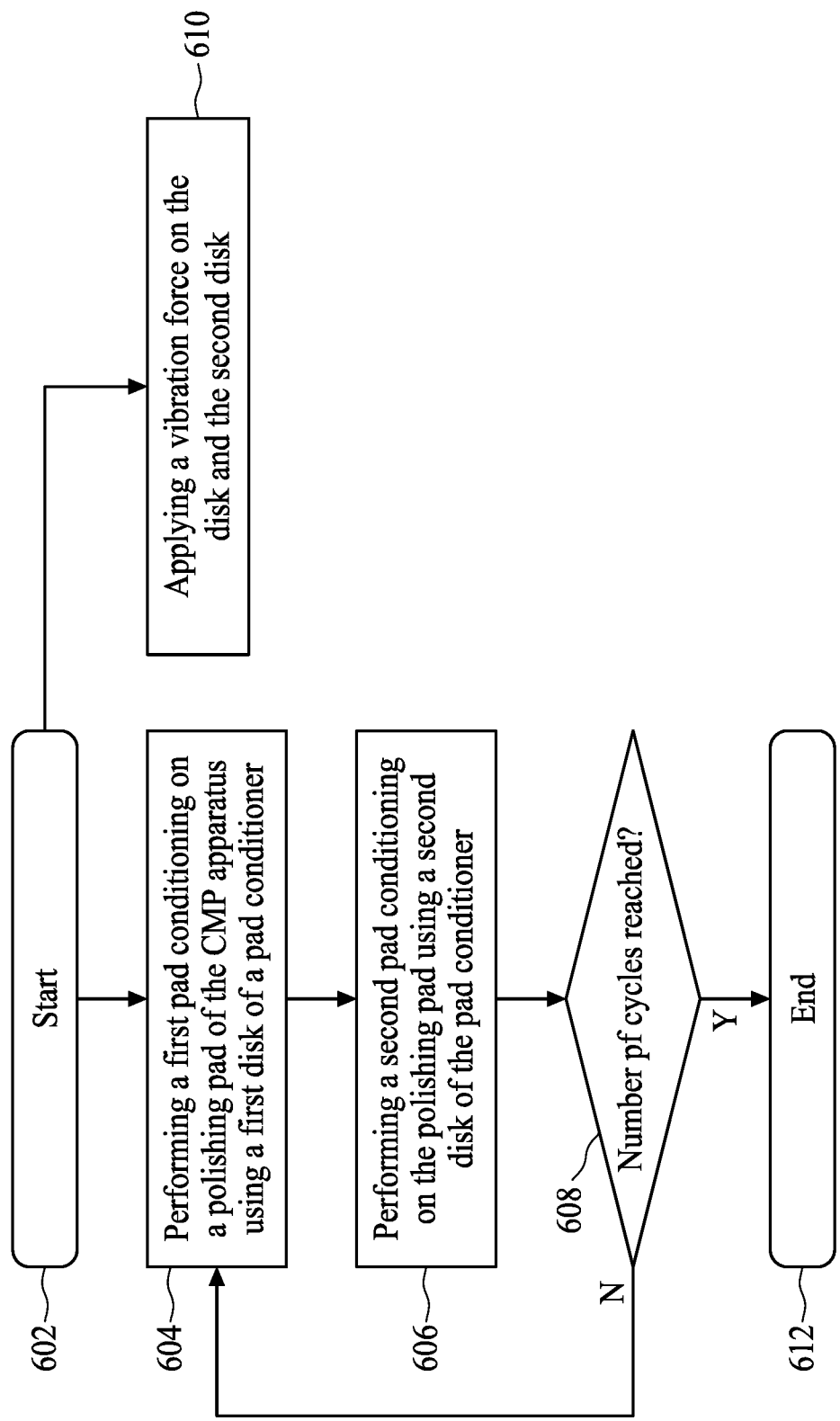
FIG. 6 is a schematic flow diagram illustrating a method of operating a CMP apparatus in accordance with some embodiments.

FIG. 6 is a schematic flow diagram illustrating a method 600 of operating a CMP apparatus in accordance with some embodiments. The method starts with step 602. In some embodiments, a pad conditioning cycle may comprise a first pad conditioning using the first disk 116 illustrated in FIG. 1 followed a second pad conditioning using the second disk 118 illustrated in FIG. 1. In some embodiments, the pad conditioning cycle may comprise a first pad conditioning using the second disk 118 followed by a second pad conditioning using the first disk 116. Each of the first pad conditioning and the second pad conditioning may last for a period between about 30 seconds to about 30 minutes. When the method 600 is started, it is determined how many cycles of pad conditioning are to be conducted. In step 604, a first pad conditioning is performed on a polishing pad of the CMP apparatus using a first disk of a pad conditioner. The first disk has a plurality of first abrasives with a first mean size. In step 606, a second pad conditioning is performed on the polishing pad using a second disk of the pad conditioner. The second disk has a plurality of second abrasives with a second mean size different than (e.g., greater than or less than) the first mean size. In some embodiments, the first pad conditioning and the second pad conditioning are performed simultaneously during a same cycle.

In step 610, a vibration force is applied to the first disk and the second disk during the first pad conditioning and the second pad conditioning. The method 600 continues with step 606 to determine if the number of cycles is reached. If affirmative, the method 600 returns back to step 602 to repeat another cycle of pad conditioning. If the number of cycles reaches a predetermined value, the pad conditioning is ended.

According to an embodiment, an apparatus for chemical mechanical polishing includes a pad conditioner. The pad conditioner includes a first disk having a first surface and a second disk having a second surface. The first surface has a first plurality of abrasives with a first mean size and the second surface has a second plurality of abrasives with a second mean size greater than the first mean size.

According to an embodiment, an apparatus of chemical mechanical polishing includes a pad conditioner. The pad conditioner has a dressing disk facing the polishing pad and a vibration module configured to vibrate the dressing disk.

According to an embodiment, a method of operating a chemical mechanical polishing (CMP) apparatus includes a pad conditioning sequence comprised of: providing a polishing pad for the CMP apparatus, the polishing pad comprising a first disk and a second disk on a same side, the first disk having a plurality of first abrasives with a first mean size and the second disk having a plurality of second abrasives with a second mean size less than the first mean size; performing a first pad conditioning on the polishing pad of the CMP apparatus using the first disk of the pad conditioner; and performing a second pad conditioning on the polishing pad using the second disk of the pad conditioner.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An apparatus for chemical mechanical polishing, comprising:
    a pad conditioner having a first disk comprising a first surface and a second disk comprising a second surface, the first surface having a first plurality of abrasives with a first mean size, and the second surface having a second plurality of abrasives with a second mean size greater than the first mean size,
    wherein the pad conditioner is configured to perform a pad conditioning method comprising alternatingly performing a first pad conditioning step using the first disk and performing a second pad conditioning step using the second disk, and the pad conditioning method is concluded with the first pad conditioning step.

2. The apparatus according to claim 1, wherein the first plurality of abrasives protrude from the first surface with a first pitch, and the second plurality of abrasives protrude from the second surface with a second pitch greater than the first pitch.

3. The apparatus according to claim 1, wherein the first plurality of abrasives protrude from the first surface with a first surface density, and the second plurality of abrasives protrude from the second surface with a second surface density less than the first surface density.

4. The apparatus according to claim 1, wherein the pad conditioner further includes a shaft configured to engage at least one of the first disk and the second disk with a polishing pad.

5. The apparatus according to claim 1, wherein the first disk comprises a first pressure sensor on the first surface, and the second disk comprises a second pressure sensor on the second surface.

6. The apparatus according to claim 1, further comprising a control module configured to determine an operation sequence for the first disk and the second disk.

7. The apparatus according to claim 1, wherein the pad conditioner further comprises a vibration module coupled to at least one of the first disk and the second disk and configured to vibrate the at least one of the first disk and the second disk.

8. An apparatus for chemical mechanical polishing, comprising a pad conditioner comprising:
    a first dressing disk and a second dressing disk facing a polishing pad, wherein the first dressing disk comprises a first plurality of abrasives with a first pitch, and the second dressing disk comprising a second plurality of abrasives with a second pitch greater than the first pitch; and
    a vibration module configured to vibrate the first and second dressing disks,
    wherein the pad conditioner is configured to perform a pad conditioning method comprising alternatingly performing a first pad conditioning step using the first dressing disk and performing a second pad conditioning step using the second dressing disk, and the pad conditioning method is concluded with the first pad conditioning step.

9. The apparatus according to claim 8, wherein each of the first and second dressing disks defines a region on a surface of the respective dressing disk, wherein the respective dressing disk comprises a plurality of abrasives distributed outside the region.

10. The apparatus according to claim 9, wherein the vibration module is spaced horizontally apart from the abrasives of the respective dressing disk.

11. The apparatus according to claim 9, wherein the abrasives are distributed in a periphery of the surface of the respective dressing disk.

12. The apparatus according to claim 9, wherein the region has a circular shape or a polygonal shape.

13. The apparatus according to claim 9, wherein the abrasives form a plurality of radial lines on the respective dressing disk.

14. The apparatus according to claim 8, wherein the vibration module is configured to generate ultrasonic waves to vibrate the respective dressing disk.

15. The apparatus according to claim 14, wherein the ultrasonic waves have a frequency greater than about 20 kilohertz.

16. A method of operating a chemical mechanical polishing (CMP) apparatus, comprising a pad conditioning sequence comprised of:
    providing a pad conditioner for the CMP apparatus, the pad conditioner comprising a first disk and a second disk on a same side, the first disk having a plurality of first abrasives with a first mean size and the second disk having a plurality of second abrasives with a second mean size less than the first mean size;
    performing a first pad conditioning on the polishing pad of the CMP apparatus using the first disk of the pad conditioner; and
    performing a second pad conditioning on the polishing pad using the second disk of the pad conditioner,
    wherein the pad conditioning sequence is concluded by performing the second pad conditioning.

17. The method according to claim 16, wherein the first pad conditioning and the second pad conditioning are performed alternately.

18. The method according to claim 17, further comprising operating a first retractable shaft and a second retractable shaft to move the first disk and the second disk, respectively, for performing the first pad conditioning and the second pad conditioning alternately.

19. The method according to claim 16, further comprising applying a vibration force to the first disk and the second disk.

20. The method according to claim 19, wherein applying a vibration force comprises generating acoustic waves of ultrasonic frequencies to apply the vibration force.

* * * * *